United States Patent
Freitas et al.

(10) Patent No.: US 11,361,209 B2
(45) Date of Patent: Jun. 14, 2022

(54) POWER ELECTRONICS FOR USE IN SMART CARDS AND OTHER APPLICATIONS

(71) Applicant: FREEVOLT TECHNOLOGIES LIMITED, London (GB)

(72) Inventors: Vitor Freitas, London (GB); Victor Diaz, London (GB); Alison Lloyd, London (GB)

(73) Assignee: FREEVOLT TECHNOLOGIES LIMITED, London (GB)

( * ) Notice: Subject to any disclaimer, the term of this patent is extended or adjusted under 35 U.S.C. 154(b) by 0 days.

(21) Appl. No.: 17/042,716

(22) PCT Filed: Mar. 29, 2019

(86) PCT No.: PCT/GB2019/050920
§ 371 (c)(1),
(2) Date: Sep. 28, 2020

(87) PCT Pub. No.: WO2019/186192
PCT Pub. Date: Oct. 3, 2019

(65) Prior Publication Data
US 2021/0012176 A1  Jan. 14, 2021

(30) Foreign Application Priority Data

Mar. 29, 2018  (GB) ...................................... 1805310
May 4, 2018    (GB) ...................................... 1807396

(51) Int. Cl.
| G06K 19/077 | (2006.01) |
| G06K 19/07  | (2006.01) |
| H01P 5/16   | (2006.01) |
| H01Q 1/22   | (2006.01) |
| H03H 7/38   | (2006.01) |

(52) U.S. Cl.
CPC ... G06K 19/07745 (2013.01); G06K 19/0723 (2013.01); H01P 5/16 (2013.01); H01Q 1/2208 (2013.01); H03H 7/38 (2013.01)

(58) Field of Classification Search
CPC ........ G06K 19/00; G06K 19/04; G06K 19/06; G06K 19/07; G06K 19/067
(Continued)

(56) References Cited

U.S. PATENT DOCUMENTS

| 9,723,434 B1 | 8/2017 | Chang et al. |
| 2007/0096842 A1 | 5/2007 | Hyun et al. |

(Continued)

FOREIGN PATENT DOCUMENTS

| EP | 3276845 | 1/2018 |
| GB | 2479723 | 10/2011 |
| GB | 2567876 | 5/2019 |

OTHER PUBLICATIONS

Search Report for GB Application No. 1805310.8, dated Aug. 27, 2019.
(Continued)

Primary Examiner — Edwyn Labaze
(74) Attorney, Agent, or Firm — Barnes & Thornburg LLP (57) ABSTRACT

Disclosed herein is a mounting system for a near field RF communications chip. The system comprises: (i) a substrate for carrying electronic components, and for providing electrical interconnections therebetween; (ii) a chip coupling carried by the substrate for connecting a near field RF communications chip (1001) to the mounting system; (iii) an auxiliary power provider (1003), separate from said near field RF communications chip, and adapted for providing electrical power output based on a received alternating electrical signal; (iv) an antenna coupling for connecting a
(Continued)

near field RF communications antenna (1006) to said mounting system; and (v) a splitter (1005), for splitting alternating electrical signals.

18 Claims, 6 Drawing Sheets

(58) Field of Classification Search
USPC .................................. 235/492, 380, 375, 487
See application file for complete search history.

(56) References Cited

U.S. PATENT DOCUMENTS

| | | |
|---|---|---|
| 2008/0018476 A1 | 1/2008 | Grasset |
| 2009/0011706 A1* | 1/2009 | Wilson ..................... H04B 5/02 455/41.1 |
| 2010/0039234 A1* | 2/2010 | Soliven .................... H04B 5/02 340/10.1 |
| 2013/0127605 A1 | 5/2013 | Beasley et al. |
| 2015/0009077 A1 | 1/2015 | Lee et al. |
| 2015/0145338 A1 | 5/2015 | Gulak et al. |
| 2015/0178526 A1 | 6/2015 | Roh et al. |
| 2016/0043658 A1 | 2/2016 | Lopez et al. |
| 2019/0362110 A1* | 11/2019 | Chahal ............... G06K 7/10297 |

OTHER PUBLICATIONS

Search Report for GB Application No. 1807396.5, dated Mar. 29, 2019.
Search Report & Written Opinion issued in Int'l Appl. No. PCT/GB2019/050920, dated Jul. 9, 2019.

* cited by examiner

POWER ELECTRONICS FOR USE IN SMART CARDS AND OTHER APPLICATIONS

This application claims priority under 35 USC § 371 of PCT Application No. PCT/GB2019/050920, filed Mar. 29, 2020, which claimed priority from United Kingdom Patent Application No. 1805310.8, filed on Mar. 29, 2018 and United Kingdom Patent Application No. 1807396.5, filed on May 4, 2018, the entirety of which are each fully incorporated by reference herein.

FIELD OF INVENTION

The present invention relates to methods and apparatus, and more particularly to methods and apparatus for auxiliary power harvesting in near field radio frequency (RF) communications enabled systems, such as systems comprising near field RF communications functionality provided by an integrated circuit.

BACKGROUND

Smart cards, also known as chip cards, or integrated circuit cards (ICC), are increasingly prevalent. A wide variety of such pocket-sized cards with embedded integrated circuits are in use in a wide variety of applications. The most frequent uses of such cards relate to financial transactions, mass transit systems, and access control. Smart cards are made of plastic, generally polyvinyl chloride, but sometimes polyethylene-terephthalate-based polyesters, acrylonitrile butadiene styrene or polycarbonate. Reusable smart cards may also be made from paper. Such cards often incorporate an integrated circuit, IC, and some source of power such as an near field RF communications interface for powering the IC and providing data communications to and from it.

An IC device, herein called a chip, traditionally consists of a single semiconductor die which has a particular function and which is adapted to interact with other chips and components. For example, a traditional chip might be a microprocessor, a memory controller, or a memory array. IC systems may include two or more chips, as well as other electronic and electrical components, each attached to and interconnected through a mounting system such as a printed circuit board.

Near field RF (radio frequency) communication requires an antenna of one near field RF communicator to be present within the alternating magnetic field (H field) generated by the antenna of another near field RF communicator by transmission of an RF signal (for example a 13.56 Mega Hertz signal) to enable the magnetic field (H field) of the RF signal to be inductively coupled between the communicators. The RF signal may be modulated to enable communication of control and/or other data. Ranges of up to several centimetres (generally a maximum of 1 metre) are common for near field RF communicators.

Near field communication in the context of this application may be referred to as near-field RF communication, near field RFID (Radio Frequency Identification) or near field communication. The range of such devices depends on the antenna used but may be, for example, up to 1 metre.

Communication of data between NFC communicators may be via an active communication mode in which the NFC communicator transmits or generates an alternating magnetic field modulated with the data to be communicated and the receiving NFC communicator responds by transmitting or generating its own modulated magnetic field, or via a passive communication mode in which one NFC communicator transmits or generates an alternating magnetic field and maintains that field and the responding NFC communicator modulates the magnetic field to which it is inductively coupled with the data to be communicated, for example by modulating the load on the inductive coupling ("load modulation"). Near field RF communicators may be actively powered, that is have an internal or associated power source, or passively powered, that is derive a power supply from a received magnetic field. Generally an RF transceiver will be actively powered while an RF transponder may be passively or actively powered.

Examples of near field RF communicators are defined in various standards for example ISO/IEC 18092 and ISO/IEC 21481 for NFC communicators, and ISO/IEC 14443 and ISO/IEC 15693 for near field RF communicators.

The ability of near field RF communications devices to be passively powered is a significant benefit. Some near field communicator chips also provide auxiliary power outputs. This can enable power harvested by the near field RF communicator to be used by other circuits.

UK patent application GB2531378 describes an RFID system in which when an RFID reader sends a command to an RFID device, the device does not respond, but rather waits and harvests the power to drive some auxiliary functionality e.g. functionality not required for responding to the command, for example the command may be a "request to provide identification code" command. In this prior art system, a response to the command from the RFID device is intentionally delayed so as to allow the auxiliary function to be performed first. In this system, the auxiliary function is biometric authentication, and the RFID device does not respond to the command until the biometric authentication has been completed.

This may extend the interaction time of the RFID device (e.g. the period of time for which an RFID device must be held in proximity to a reader). The perceived delay in operation associated with this may be unacceptable to users.

SUMMARY

Aspects and examples of the present invention are set out in the appended claims.

In an aspect there is provided a mounting system for a near field RF communications chip, which mounting system may be integrated into a smart card. The system comprises a substrate for carrying electronic components and electrical interconnections therebetween;

a chip coupling carried by the substrate for connecting a near field RF communications chip to the mounting system;

an auxiliary power provider, separate from said near field RF communications chip, and adapted for providing electrical power output based on a received alternating electrical signal; and, an antenna coupling for connecting a near field RF communications antenna to said mounting system; and a splitter, for splitting alternating electrical signals, the splitter comprising a network of lumped capacitors comprising:

a first stage, MN1, connected to the antenna coupling and having a first input impedance Z1 and a first output impedance Z1';

a second stage, MN2, connected to the first stage and to the auxiliary power provider for providing a first part of the alternating electrical signal to the auxiliary power provider, the second stage having second input impedance Z2' and a second output impedance Z2;
and
a third stage, MN3, connected to the first stage and to the chip coupling for providing a second part of the alternating electrical signal to the chip coupling, the second stage having third input impedance Z3' and a third output impedance Z3;
wherein the lumped capacitors have capacitance values selected so that the first output impedance, Z1', matches the complex conjugate of the sum of the second input impedance, Z2', and the third input impedance, Z3'.

It will be appreciated in the context of the present disclosure that the first output impedance, Z1', "matching" the complex conjugate of the sum of the second input impedance, Z2', and the third input impedance, Z3' may comprise it being substantially equal to the complex conjugate of that sum, for example it may be of the same order of magnitude for example it may be equal to within a tolerance of less than ±90%, for example less than ±30%, for example less than ±10%, for example less than ±1%. In some cases it may be exactly equal to that sum.

It will also be appreciated in the context of the present disclosure that the second stage and the third stage may also be connected to each other. For example, input terminals of the second stage may be connected to input terminals of the third stage so that the same signal can be applied to both. For example they may each have input terminals connected to output terminals of the first stage for receiving such a signal.

The auxiliary power provider may comprise an auxiliary rectifier separate from the near field RF communicator. The near field RF communicator for connection to the chip coupling may comprise an IC.

The sum of the imaginary part of the second input impedance and the imaginary part of the third input impedance may be of equal magnitude and opposite sign to the imaginary part of the first output impedance. The network may consist solely of lumped capacitors, as opposed to distributed components.

The capacitances of these lumped capacitors may be chosen so that the real part of the first output impedance, Z1', is greater than or equal to the real part of the first input impedance Z1.

The capacitances of the lumped capacitors may be chosen so that the real part of the second input impedance, Z2', is less than or equal to the real part of the second output impedance Z2.

The imaginary part of the input impedance of the auxiliary rectifier may be positive. In which case, the second stage MN2 may be configured so that the real part of the second input impedance Z2' is greater than or equal to the real part of the second output impedance Z2.

The imaginary part of the input impedance of the near field RF communicator may be positive, in which case, In which case, the third stage MN3 may be configured so that the real part of the third input impedance Z3' is greater than or equal to the real part of the third output impedance Z3.

It will be appreciated by the skilled addressee in the context of the present disclosure that the impedances referred to herein may change depending on the alignment of the near field RF communications antenna relative to the near field communicator operating in reader mode and/or depending on the distance between the two. In other words, the impedance of the circuit may change depending how it is positioned relative to the reader. Reference made to impedances herein therefore may refer to impedances measured when the system receives a near field RF signal from the contactless smart card interface of an Omnikey 5421 Dual interface contactless and contact smart card reader (manufactured by HID Global Corporation of 611 Center Ridge Dr, Austin, Tex. 78753, USA). This contactless smart card interface may operate using a 13.56 MHz carrier frequency and in accordance with ISO 14443 A/B and ISO 15693. The apparatus may be placed in perfect alignment with the reader, flat on its surface, and the distance between the reader and the apparatus may be varied from 0 to 60 mm, in steps of 5 mm. Other test setups may be used to characterise the impedances described herein.

The capacitances of the lumped capacitors may be chosen so that the real part of the third input impedance, Z3', is less than or equal to the real part of the third output impedance Z3.

The network may be configured so that the second output impedance is maintained in the event of fluctuations in the third output impedance; and
the third output impedance is maintained in the event of fluctuations in the second output impedance.

An aspect of the disclosure comprises a smart card comprising any of the mounting systems or power splitter described herein. Such a smart card may comprise a near field RF communications antenna.

An aspect provides a near field RF communications apparatus comprising:
a near field RF communicator,
an auxiliary rectifier separate from the near field RF communicator, and
a splitter connected to the auxiliary rectifier and to the near field RF communicator for connection to a near field RF communications antenna, wherein the splitter is for splitting alternating electrical signals received by said antenna, the splitter comprising:
a first stage, MN1, for connection to the antenna and having a first input impedance Z1 and a first output impedance Z1';
a second stage, MN2, connected to the first stage and to an auxiliary rectifier for providing a first part of the alternating electrical signal to the auxiliary rectifier, the second stage having second input impedance Z2' and a second output impedance Z2;
and
a third stage, MN3, connected to the first stage and to a near field RF communications chip for providing a second part of the alternating electrical signal to the chip, the second stage having third input impedance Z3' and a third output impedance Z3;
wherein the splitter comprises a network of components having impedances selected so that the first output impedance, Z1', is equal to the complex conjugate of the sum of the second input impedance, Z2', and the third input impedance, Z3'.

The components may comprise lumped components, for example the network may consists solely of lumped capacitors.

In an aspect there is provided a mounting system for a near field RF communications chip, the system comprising:
a substrate for carrying electronic components, and for providing electrical interconnections therebetween;
a chip coupling carried by the substrate for connecting a near field RF communications chip to the mounting system;
an auxiliary power provider, separate from said near field RF communications chip, and adapted for providing electrical power output based on a received alternating electrical signal; and, an antenna coupling for connecting a near field RF communications antenna to said mounting system; and
a splitter, for splitting alternating electrical signals, the splitter comprising:
a first port connected to the antenna coupling and having a first input impedance;
a second port connected to the first port and configured to provide a first part of the alternating electrical signal to the auxiliary power provider; and
a third port connected to the first port and configured to provide a second part of the alternating electrical signal to the chip coupling;
wherein the splitter is configured to maintain the first input impedance so that:
the output impedance of the second port is maintained in the event of fluctuations in the output impedance of the third port; and
the output impedance of the third port is maintained in the event of fluctuations in the output impedance of the second port.

The first input impedance may be matched to the output impedance of said near field RF communications antenna, and the output impedance of the second port is selected to match the input impedance of the near field RF communications chip.

The splitter may be configured to provide, at the first port, variations in electrical load corresponding to the variations in electrical load at the third port. The splitter may be configured so that the first part of the alternating electrical signal comprises more power than the second part of the alternating electrical signal. The splitter may comprise a network of lumped components, as opposed to distributed components such as transmission lines. The network may comprise a Wilkinson divider.

An aspect of the disclosure provides a near field RF communications apparatus comprising:
a near field RF communicator;
an antenna for coupling with an alternating H-field;
an auxiliary rectifier, separate from the near field RF communicator
a splitter comprising a network of lumped components, wherein the network is connected to receive an alternating electrical signal from the antenna, and to provide a first part of the alternating electrical signal to the auxiliary rectifier and to provide a second part of the alternating electrical signal to the near field RF communicator.

The splitter of such an apparatus may comprise: a first port connected to the antenna and having a first input impedance;
a second port connected, by the network, to the first port and connected to the auxiliary rectifier; and
a third port connected, by the network, to the first port and to the near field RF communicator.

This splitter may be configured so that: the output impedance of the second port is maintained in the event of fluctuations in the output impedance of the third port; and
the output impedance of the third port is maintained in the event of fluctuations in the output impedance of the second port.

The first input impedance may be matched to the output impedance of the antenna, and the second port may have an output impedance selected to match the input impedance of the near field RF communicator.

The near field RF communicator may be provided by an integrated circuit, such as a chip, that is separate from the splitter.

An aspect of the disclosure provides a power splitter for a near field RF communications apparatus, the power splitter comprising:
a first port for receiving an alternating electrical signal from a near field communications antenna;
a second port connected to the first port and configured to provide a first part of the alternating electrical signal to a rectifier of an auxiliary power provider;
a third port connected to the first port and configured to provide a second part of the alternating electrical signal to a near field RF communicator to enable the near field RF communicator to communicate via the near field communications antenna;
a network of lumped components configured to connect the first port to the second port and the third port, and to provide:
an input impedance at the first port which matches the output impedance of the antenna at the first port;
an output impedance at the second port which matches the input impedance of the rectifier; and
an output impedance at the second port which matches the input impedance of the near field RF communicator.

The network of lumped components may be configured to split alternating electrical signals of a near field RF communications frequency band. For example it may comprise a Wilkinson divider.

The near field RF communications frequency band may comprise 13.56 MHz.

An aspect of the disclosure provides a smart card for carrying a near field RF communications chip, and a near field RF communications antenna, the smart card comprising:
an auxiliary rectifier separate from the near field RF communications chip for providing electrical power to auxiliary circuitry;
a power splitter comprising a network of lumped capacitors and printed coil inductors, wherein the network is connected to receive an alternating electrical signal from the antenna, and to provide a first part of the alternating electrical signal to the auxiliary rectifier and to provide a second part of the alternating electrical signal to the near field RF communicator.

The splitter may comprise:
a first port for connection to the antenna and having a first input impedance;
a second port connected, by the network, to the first port and connected to the auxiliary rectifier; and
a third port connected, by the network, to the first port for connection to the near field RF communicator chip.

The splitter may be configured so that:
the output impedance of the second port is maintained in the event of fluctuations in the output impedance of the third port; and
the output impedance of the third port is maintained in the event of fluctuations in the output impedance of the second port.

BRIEF DESCRIPTION OF DRAWINGS

Embodiments of the disclosure will now be described in detail with reference to the accompanying drawings, in which.

In the drawings like reference numerals are used to indicate like elements.

SPECIFIC DESCRIPTION

Figure 1:
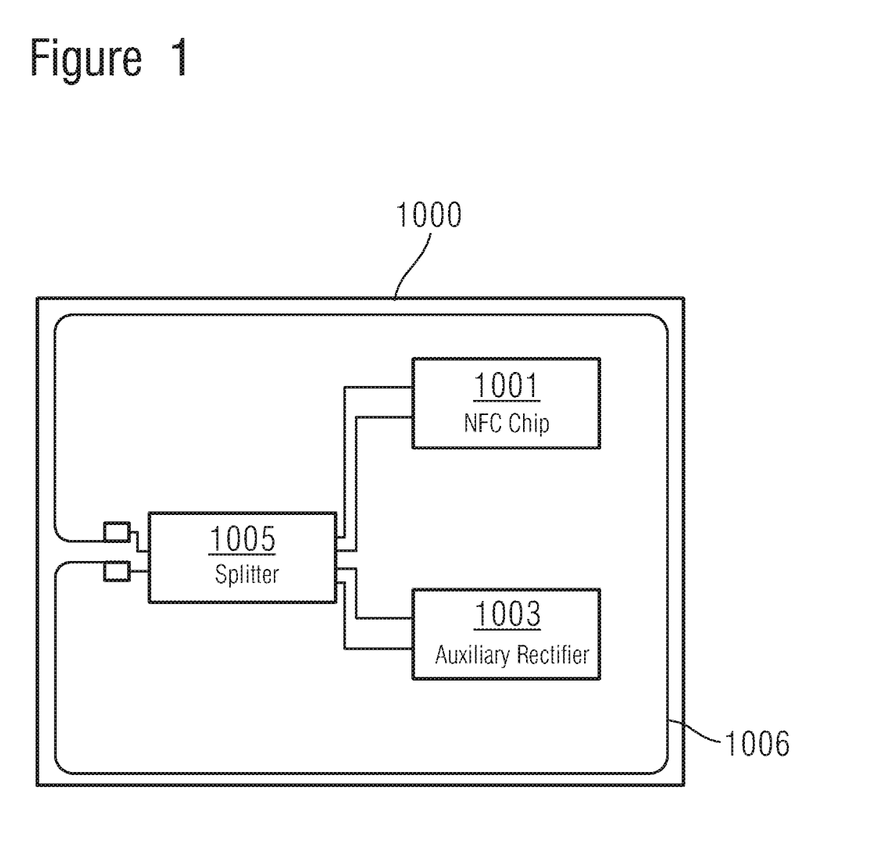
FIG. 1 illustrates a smart card comprising a system that includes a splitter, an NFC Chip, and an auxiliary rectifier.

FIG. 1 illustrates a smart card 1000 comprising a system 1001, 1003, 1005 according to the present disclosure and a near field RF communications antenna 1006. This may be a low profile system adapted for being fully encapsulated within a smart card having a thickness of less than 3 mm, for example less than 2 mm, for example about 0.76 millimetres (0.030 in) thick.

The smart card 1000 may have dimensions of a credit card such as that defined in ISO/IEC 7810 standard, for example it may be about 85 mm by about 55 mm (for example 85.60 by 53.98 millimetres). As an alternative, it may have an ID-000 form factor, e.g. about 25 mm by 15 mm (0.98 in×0.59 in) commonly used in SIM cards.

The smart card 1000 may comprise a body of a dielectric substance such as plastic, e.g. polyvinyl chloride, or a polyethylene-terephthalate-based polyester. The body of the smart card encapsulates the antenna 1006, and the system 1001, 1003, 1005. The system comprises a splitter 1005, a near field RF communications apparatus 1001, in the form of an IC, and an auxiliary rectifier 1003. It may also comprise some auxiliary circuits (not shown in FIG. 1) connected to the rectifier for performing auxiliary smart card functions such as biometrics and/or data processing function.

The splitter 1005 is connected to the near field RF communications antenna for receiving an alternating electrical signal. A first output from the splitter is connected to the near field RF communications apparatus and a second output from the splitter is connected to the auxiliary rectifier.

Figure 2:
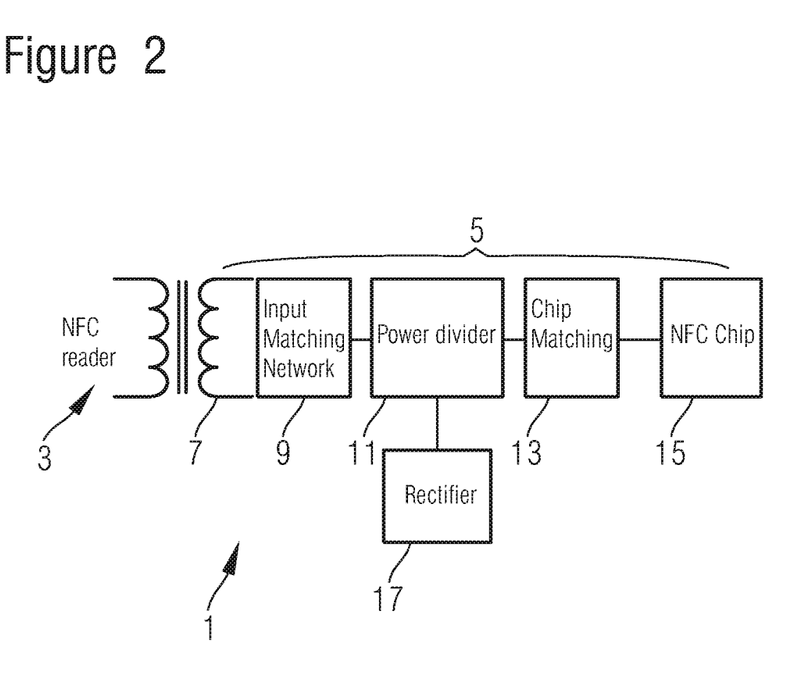
FIG. 2 shows a system comprising an NFC reader, and a near field RF communications apparatus.

FIG. 2 shows a system 1 comprising an NFC reader 3, and a near field RF communications apparatus 5.

The near field RF communications apparatus 5 comprises an NFC antenna 7, connected by a power splitter 9, 11, 13 to a near field RF communicator chip 15 and to an auxiliary rectifier 17, which is separate from the near field RF communicator 15.

The power splitter comprises a power divider 11, an input matching network 9, and a chip matching network 13. The input matching network 9 connects the antenna 7 to the power divider 11, and the chip matching network 13 connects the power divider 11 to the near field RF communicator chip 15.

The NFC antenna 7 comprises an electrical conductor such as a conductive track or wire arranged for coupling inductively with an alternating H-field to provide an alternating electrical signal. Typically, such an antenna 7 comprises a loop having one or more turns. It will be appreciated in the context of the present disclosures that an NFC antenna may have a large inductance, perhaps of 1 µH or more. Such antennas may be adapted for coupling with signals in a near field RF frequency band, which generally comprises 13.56 MHz. It will be appreciated in the context of the present disclosure that such signal may have a wavelength of approximately 22 m.

The near field RF communicator chip 15 comprises an integrated circuit, which may be implemented as a single semiconductor die. This chip 15 may comprise a front end, for connection to the antenna. The front end may include things such as a voltage regulator, a dedicated rectifier for the near field RF communicator, or other circuitry for connecting the near field RF communicator to the antenna. The chip 15 also comprises a controller for performing simple data operations such as modulating and demodulating data from signals received via the antenna.

The auxiliary rectifier 17 comprises a rectifying element, such as a diode, arranged to convert the alternating electrical signal received from the splitter into a direct current, DC, electrical signal. This DC electrical signal may be used to power an auxiliary circuit, such as a biometric processing device. The rectifier may also comprise components for matching the input and/or output impedance of the rectifier to the circuits to which it is connected.

The power splitter 9, 11 comprises lumped components connected together in a network to provide (a) an input matching network 9 for providing an input impedance which matches the output impedance of the antenna, and (b) the power divider 11 which divides an alternating electrical signal received from the antenna 7 via the input matching network 9 into two parts and (c) the chip matching network 13 for providing an output impedance from the power splitter 9, 11, 13 which matches the input impedance of the near field RF communications chip 15. This splitter may also comprise a rectifier matching network for providing an output impedance from the power splitter 9, 11, 13 which matches the input impedance of the rectifier.

Figure 4:
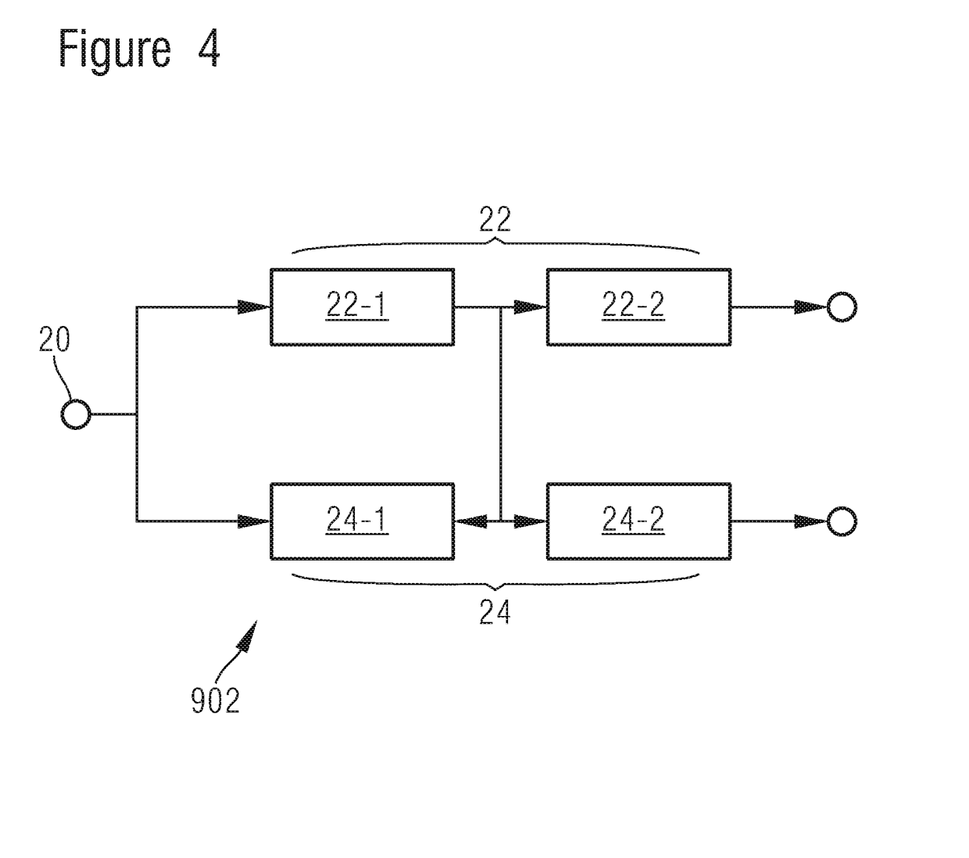
FIG. 4 shows a power splitter for use in near field communications apparatus such as those described with reference to FIG. 2.
Figure 6:
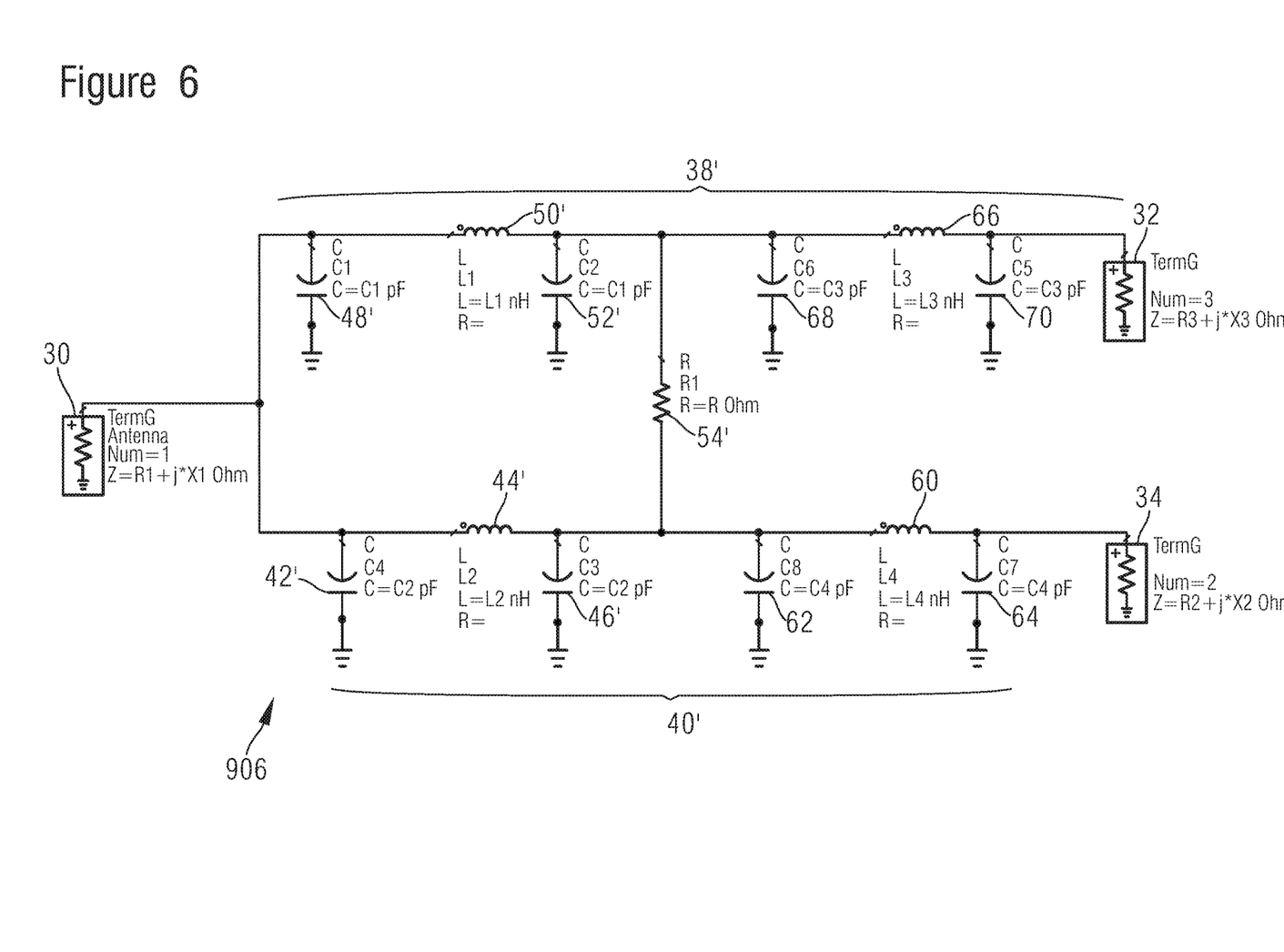
FIG. 6 shows another such power splitter.

The two parts of the electrical signal provided by the power divider 11 comprise a first part and a second part. The power divider is configured to provide the first part to the rectifier, e.g. via the rectifier matching network (not shown in FIG. 2), and to provide the second part to the near field RF communicator chip, e.g. via the chip matching network 13. For example, the power divider 11 may comprise a bifurcated electrical conduction path, starting at an input leg and splitting into two arms, one via the chip matching network 13 and the other via the rectifier matching network. The two arms may each comprise a complex output impedance to introduce a selected phase shift to an alternating electrical signal. The phase shift introduced by each of the two arms may be equal to that introduced by the other. The two arms may be connected together by a pure real impedance (e.g. by an ohmic resistive impedance). This connection between the two arms may be provided at the ends of the arms (and this is typically the case in an even divider, in which the input power is split 50:50 between the two arms. In uneven dividers, this connection between the two arms may be at some intermediate position along their length. For example, if each arm comprises a series of stages, each introducing a particular phase shift then the two arms may be connected together by a pure real impedance at the transition between one of these stages and the next. For example, if each arm provides a π phase shift (180°) in two π/4 (90°) stages, the two arms may be connected together by a pure real impedance at the π/4 (90°) point after the first stage. If other numbers of stages, and other phase shifts are used, this connection may be positioned differently. Typically, this connection links points of equal phase on the two arms. FIG. 4, and FIG. 6 each provide examples of this type of splitter. It will be appreciated in the context of the present disclosure that the phase shift associated with either or both of the arms of the splitter may be provided solely by said arm(s) or may be provided in part by a matching network coupled between that arm and its output (the rectifier or the chip, as the case may be).

Operation of an apparatus 5 such as that described above with reference to FIG. 2 will now be described. To initiate operation, a reader device 3, such as an RFID reader, or an NFC device operating in reader mode, provides a time varying H-field to the antenna, e.g. at a frequency of 13.56 MHz. By coupling with this H-field, the antenna provides an alternating electrical signal to the power divider via the antenna matching network. The power divider splits this input signal to provide two output parts. The first part is provided via the rectifier matching network to the rectifier, and the second part is provided to the near field RF communicator via the chip matching network. The near field RF communicator may derive electrical power from the second part of the alternating signal, and may receive data modulated onto the alternating signal by the NFC reader. It may also respond to this data by sending data back to the NFC reader. This may be done by load modulation—e.g. by varying the impedance presented to the chip matching network. While the near field RF communicator is communicating, e.g. using load modulation, the rectifier converts the second part of the alternating electrical signal to DC electrical energy, e.g. to power an auxiliary circuit. During this period, the rectifier may present a constant load (e.g. a constant impedance at the rectifier port).

It will be appreciated in the context of the present disclosure that, although the diagram of FIG. 2 illustrates these as separate functional components, their functionality may be provided by a single integrated network of lumped components. For example, some or all of the functionality of the matching network(s) may be provided by the power splitter, and vice versa.

Figure 3A:
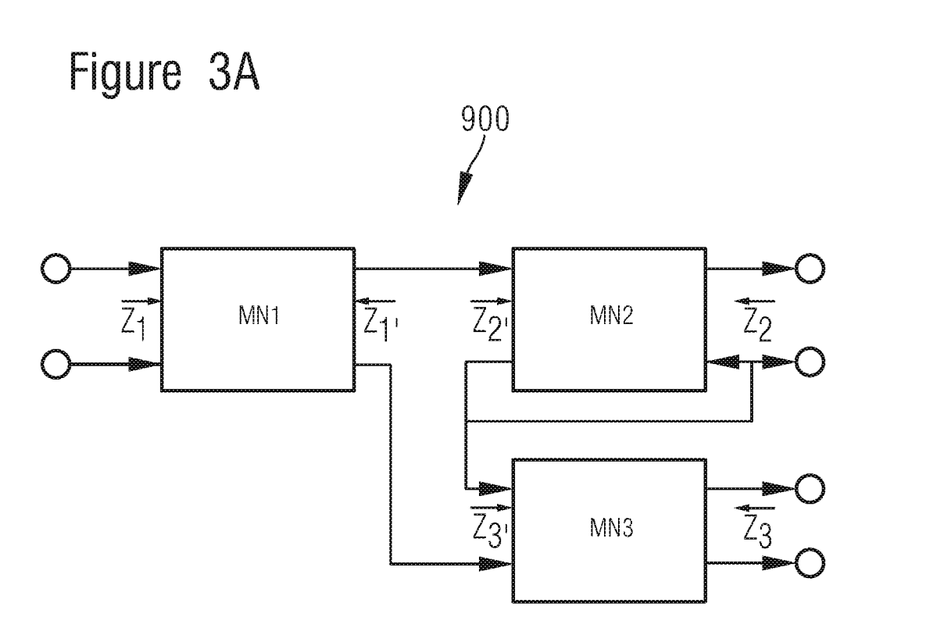
FIG. 3A shows a power splitter for use in near field communications apparatus such as those described with reference to FIG. 2.

FIG. 3A shows a schematic diagram of a splitter such as the splitter 9, 11, 13 described above with reference to FIG. 2. This splitter comprises an antenna matching network MN1, a chip matching network, MN3.

The power splitter 900 illustrated in FIG. 3A comprises a matching network having three stages, a first stage is provided by an antenna matching network, MN1, a second stage by a rectifier matching network, MN2, and a third stage by a communications chip matching network, MN3.

The antenna matching network MN1 has an input port comprising two input connections, and an output comprising two output connections. Likewise, the chip matching network and the rectifier matching network each have an input port comprising two input connections, and an output port comprising two output connections.

The two input connections of the antenna matching network can be connected to an antenna, which can provide an alternating electrical signal to the splitter. The first output connection of the antenna matching network, MN1, is connected to the first input connection of the rectifier matching network, MN2, whereas the second output connection of the antenna matching network, MN2, is connected to the second input connection of the chip matching network, MN3. The second input connection of the rectifier matching network, MN2 is connected to the first input connection of the chip matching network, MN3, and to the second output connection of the rectifier matching network, MN2.

The antenna matching network MN1 comprises a network of passive components, having some reactive impedance, such as capacitance and/or inductance. The antenna matching network may be arranged to provide an input impedance, Z1, which matches the output impedance of a near field RF communications antenna. It may have an output impedance Z1'. Likewise, the chip matching network and rectifier matching network may also each comprise a network of such passive components. The input impedance of the chip matching network may be Z2', and its output impedance Z2. The input impedance of the rectifier matching network may be Z3', and its output impedance Z3.

In an embodiment, the impedance Z1 may be consist essentially of an impedance with a positive imaginary part, while Z2 and Z3 may each consist essentially of complex impedance with either a positive or a negative imaginary part.

The impedance Z1' may be equal to the conjugate of the sum of the impedances Z2' and Z3'. The ratio of the real part of Z2' to Z3' may define the ratio of the split of input power from the antenna to the output connections of the chip matching network and the rectifier matching network.

Figure 3B:
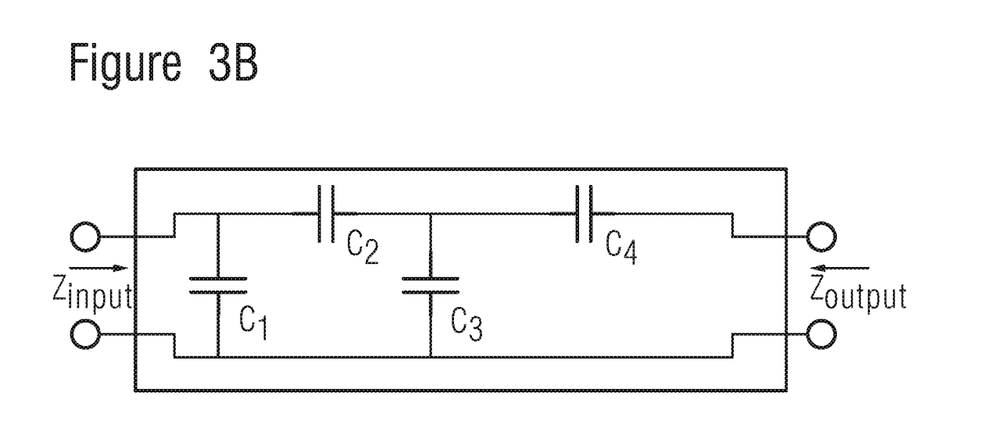
FIG. 3B shows a matching network for use in a power splitter such as that illustrated in FIG. 3A.

FIG. 3B is one example of a matching network which may be used to provide any one of the matching networks/stages MN1, MN2, MN3 illustrated in FIG. 3A.

The matching network illustrated in FIG. 3B consists solely of capacitive impedances. It has a first input terminal and a second input terminal a first capacitor C1, a second capacitor C2, a third capacitor C3, and a fourth capacitor C4. It also has a first output terminal and a second output terminal. The first input terminal is connected to a first plate of the first capacitor C1 and to a first plate of the second capacitor C2. The second input terminal is connected to a second plate of the first capacitor C1 and to the second output terminal. A first plate of the third capacitor C3 is also connected to the second input terminal. A second plate of the third capacitor C3 is connected to a second plate of the second capacitor C2, and to a first plate of the fourth capacitor C4. The second plate of the fourth capacitor C4 is connected to the first output terminal.

This network of capacitors provides an input impedance $Z_{INPUT}$ at the input terminals, and an output impedance $Z_{OUTPUT}$ at the output terminals. The capacitance of each of these four capacitors C1, C2, C3, C4 is selected to provide a particular input impedance $Z_{INPUT}$ and a particular output impedance $Z_{OUTPUT}$. Although this network is illustrated as a standalone module, it will be appreciated in the context of the present disclosure that the output impedance of the matching network MN1 may depend to some degree on the output impedance of the circuit connected to its inputs. Likewise, the input impedance of the matching networks MN2, MN3 may depend on the input impedance of any load connected to their outputs.

Each of the three matching networks, MN1, MN2, MN3 of the splitter shown in FIG. 3A may have this structure. The capacitance values of the capacitors in these three networks may be selected so that the output impedance of MN1, Z1', is equal to the complex conjugate of the sum of the input impedances of MN2 and MN3, viz:

$$Z_1'=(Z_2'+Z_3')*$$

Splitter divides the power of an electrical input signal received at its inputs between its two outputs, in the case of the system illustrated in FIG. 1, between the near field RF communications apparatus and the auxiliary rectifier. The ratio of the real parts of the input impedances $Z_2'$, $Z_3'$ of MN2, and MN3 may set the ratio of this split in electrical power, R. e.g:

$$R=Re\{Z_2'\}/Re\{Z_3'\}$$

Wherein R is the ratio of the power provided to the rectifier to the power provided to the near field RF communications IC.

The imaginary part of these two impedances may be selected to comply with the following criterion:

$$Im\{Z_1'\}=-Im\{Z_2'\}-Im\{Z_3'\}$$

In other words, the sum of the imaginary parts of the input impedances of the two matching networks MN2 and MN3 should be of equal magnitude and opposite sign to the output impedance of the matching network MN1. These and other embodiments enable the inductance of components connected to the matching networks MN1, MN2, MN3, such as the antenna and the rectifier, to contribute to matching the impedance of the splitter to the circuits to which it is connected.

The capacitor values of the each matching network MN1, MN2, MN3 are then selected so that:

$$Re\{Z2'\}=Re\{Z3'\}*R$$

$$Re\{Z1'\}=Re\{Z2'\}+Re\{Z3'\}$$

$$Im\{Z1'\}=-Im\{Z2'\}-Im\{Z3'\}$$

In other words—the ratio R is the ratio of the real part of the input impedance of MN2 to the real part of the input impedance MN3. The real part of the output impedance of MN1 is equal to the sum of the real parts of the input impedances of MN2 and MN3. And finally, as noted above, the sum of the imaginary parts of the input impedances of the two matching networks MN2 and MN3 should be of equal magnitude and opposite sign to the output impedance of the matching network MN1. The capacitor values for the four capacitors used in each matching network may be selected so that all three of these constraints may be satisfied.

In addition, these capacitor values may be chosen so that the following constraints are also fulfilled
- The real part of Z1' is greater than or equal to the real part of Z1;
- The real part of Z2' is less than or equal to the real part of Z2;
- The real part of Z3' is less than or equal to the real part of Z3; and
- The imaginary part of Z1' is positive enough to cancel out (complement) the imaginary part of Z2' and Z3'.

In some cases, the matching networks may be arranged to meet other constraints. For example, the real part of Z2' and Z3' may be greater than or equal to the real part of Z2 and Z3.

FIG. 4 is a functional block diagram or another example of a splitter 902 such as that described above with reference to FIG. 2.

The splitter shown in FIG. 4 has an input leg for connection to an antenna. The input leg 20 is connected by a bifurcated electrical conduction path to two output arms 22, 24. The first output arm 22 comprises an input stage 22-1 and an output stage 22-2, which are connected together in series. Likewise, the second output arm 24 also comprises an input stage 24-1 and an output stage 24-2.

The input stage 22-1 of the first arm 22 is connected between the input leg 20 and the output stage 22-2 of the first arm 22. The input stage 24-1 of the second arm 24 is connected between the input leg 20 and the output stage 24-2 of the second arm 24. The connection between the input stage and the output stage of the first arm 22 may be connected, e.g. by a resistor (not shown) or other pure real impedance, to the connection between the input stage 24-1 and the output stage 24-2 of the second arm 24.

The input stages and output stages of the two arms 22, 24 may each comprise networks of passive, reactive, components such as inductors and capacitors arranged to provide a phase shift to the input signal. These may be lumped components. The phase shift provided by the input stage 22-1, 24-1 of each arm 22, 24 may be equal to that provided by the input stage of the other arm 24, 22. Also, the phase shift provided by the output stage of each arm may be equal to that provided by the output stage of the other arm. These stages may be arranged as either high pass filters, or low pass filters. Significantly, the use of such structures may reduce changes in the output impedance of one arm due to changes in the load/impedance presented at the output of the other arm. By selecting the impedance of these different stages appropriately, the power of the alternating electrical signal received from the input leg may be divided between the two arms according to a selected ratio, R.

The division of power between the first arm and the second arm may be controlled by selecting the ratio of the impedance of the input stage of the each arm relative to the output stage of that arm, and by selecting the ratio of the impedance of the input stage of the first arm to the impedance of input stage of the second arm. For example, a ratio of power division, R, may be provided between a 'main branch' arm which takes more of the power from the input leg than a 'secondary branch' arm. To achieve this, the magnitude of the impedance of the input stage of the 'main branch' arm may be 1/R of the impedance of the input stage of the 'secondary branch' arm. The 'main branch' arm output stage may have an impedance equal to the 'main branch' arm input stage divided by the square root of (1+R). The 'secondary branch' output stage may have an impedance equal to the 'main branch' arm input stage divided by the square root of (R*(1+R)).

The splitter 902 shown in FIG. 4 is illustrated as being single ended, but it will be appreciated in the context of the present disclosure that differential embodiments may also be provided.

Figure 5:
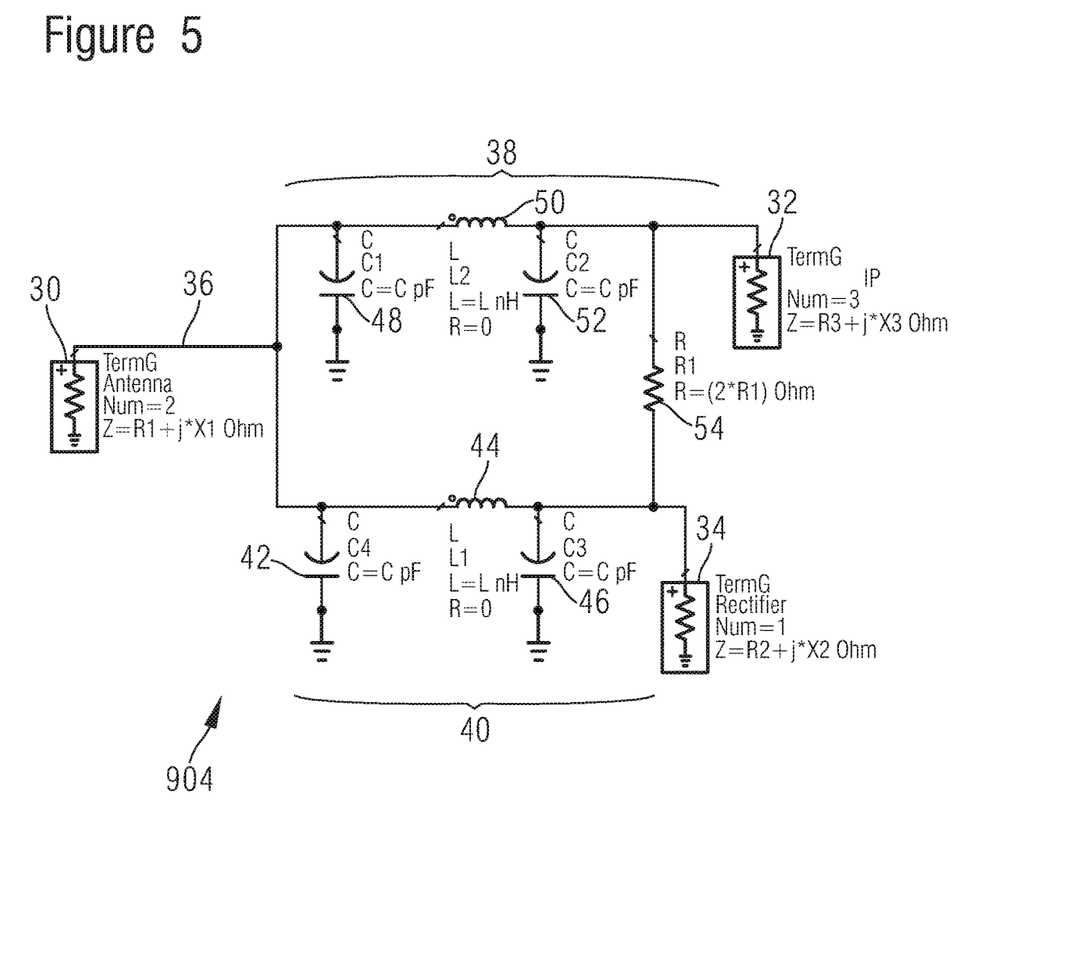
FIG. 5 shows a power splitter for use in near field communications apparatus such as those described with reference to FIG. 2.

FIG. 5 shows a power splitter such as that described above with reference to FIG. 2, and FIG. 4. Unlike those two power splitters however, the splitter illustrated in FIG. 5 may provide an even 50:50 split of input power.

The splitter 904 in FIG. 5 comprises an antenna coupling 30, a rectifier coupling 34, a communicator coupling 32. It also comprises an input leg 36 and two arms 38, 40, each providing an electrical conduction path for an alternating electrical signal. The input leg 36 joins the antenna coupling 30 to a junction with the two arms 38, 40. At the junction the conduction path provided by the input leg 30 bifurcates into two conduction paths provided by the two arms 38, 40. The first arm 40 joins the junction to the rectifier coupling 34 for connection to a rectifier. The second arm 38 joins the junction to the communicator coupling 32, e.g. for connection to a near field RF communicator such as a chip.

The first arm 40 comprises a first capacitor 42 connected between the junction and a reference voltage connection such as ground. It also comprises a first inductor 44 connected between the junction and a second capacitor 46. The second capacitor 46 is connected in series between the first inductor 44 and the reference voltage connection. The connection between the first inductor 44 and the second capacitor 46 is also connected to the rectifier coupling 34. The complex impedance of the first arm 40 may be selected to introduce a phase shift, such as 90°, into an alternating signal of the near field communications frequency band.

The second arm 38 comprises a third capacitor 48 connected between the junction and the reference voltage connection. It also comprises a second inductor 50 connected between the junction and a fourth capacitor 52. The fourth capacitor 52 is connected in series with the second inductor 50 and the junction, and between the second inductor 50 and the reference voltage connection. The connection between the second inductor 50 and the fourth capacitor 52 is connected to the communicator coupling 32.

The rectifier coupling 34 is connected to the chip coupling 32 by a resistor 54. The complex impedance of the second arm 38 may be selected to introduce a phase shift, such as 90°, into an alternating signal of the near field communications frequency band.

The first arm 40 and the second arm 38 may each have a complex output impedance, for example they may each introduce a phase shift to the alternating electrical signal. The first arm and the second arm may be configured to introduce an identical phase shift. For example each may be configured to introduce a 90° phase shift.

In terms of the division of power between the two arms, the split provided by such an arrangement may be even. The magnitude of the combined impedance provided by the first arm and the second arm together at the junction may be equal to the magnitude of the output impedance of the input leg. For example, in an even splitter such as that illustrated in FIG. 5, each arm may have an input impedance equal to twice the magnitude of the output impedance of the input leg. In an even splitter the magnitude of the complex impedance of the first arm may be equal to that of the second arm.

In the system shown in FIG. 5, the first capacitor 42, the second capacitor 46, the third capacitor 48 and the fourth capacitor 52 may all have the same capacitance. This capacitance may be on the order of pico-farad, e.g. between $1*10^{-13}$ F and $1*10^{-8}$ F. The first inductor 44 and the second inductor 50 may also have the same inductance, and this may be on the order of nano-henry, e.g. between $1*10^{-10}$ H and $1*10^{-5}$ H. The resistor which connects the rectifier coupling to the chip coupling may have a resistance equal to twice that of the real part of the antenna impedance and/or twice that of the real part of the output impedance of the input leg.

Any combination of capacitors placed in parallel may be combined into a single capacitor with a value that may be the addition of the capacitance of each single capacitor (for example capacitor 42 and 48)

FIG. 6 shows another power splitter 906 such as that described above with reference to FIG. 2. FIG. 6 is one example of an uneven splitter.

In an uneven splitter, configured to provide more power to the auxiliary rectifier than to the near field RF communicator, the magnitude of the complex impedance of the second arm 38' (to the communicator) may be greater than that of the first arm 40'. For example the splitter 906 may provide 70% of the power to the rectifier and 30% to the communicator. In such a system, the magnitude of the complex impedance of the first arm 40' may have a selected relation to that of the second arm 38', such as that described above with reference to FIG. 4. Different splits may be provided.

Although the component values may be different (see below), the splitter shown in FIG. 6 has the same structure as that illustrated in FIG. 5, other than as follows. In the first arm 40', a third inductor 60 is connected in series between the first inductor 44' and the rectifier coupling 34. A fifth capacitor 62 connects the reference voltage to the connection between the first inductor 44' and the third inductor 60.

A sixth capacitor 64 connects the reference voltage to the connection between the third inductor 60 and the rectifier coupling 34.

In the second arm 38', a fourth inductor 66 is connected in series between the second inductor 50' and the chip coupling 32.

A seventh capacitor 68 connects the reference voltage to the connection between the second inductor 50' and the fourth inductor 66. An eighth capacitor 70 connects the reference voltage to the connection between the fourth inductor 66 and the chip coupling 32.

The resistor 54' connects the connection between the first inductor 44' and the third inductor 60 to the connection between the second inductor 50' and the fourth inductor 66.

Any combination of capacitors placed in parallel may be combined into a single capacitor with a value that may be the addition of the capacitance of each single capacitor (for example capacitor 42' and 48', capacitor 52' and 68, capacitor 46' and 62)

As to component values, in the system shown in FIG. 6, the first capacitor and the second capacitor may have the same capacitance as each other. And, the third capacitor and the fourth capacitor may have the same capacitance as each other, and this may be different to that of the first and second capacitor. The capacitances may all be on the order of tens of pico-farad up to tens of nano-farad, e.g. between $1*10^{-13}$ F and $1*10^{-8}$ F. The first inductor and the second inductor may have different inductances from each other, and this may be on the order of nano-henry to tens of micro-henry, e.g. between $1*10^{-10}$ H and $1*10^{-5}$ F. The resistor which connects the two arms together may have a resistance equal to that of the real part of the antenna impedance and/or that of the real part of the output impedance of the input leg.

In FIG. 6, it can be seen that the first arm 40' comprises two stages: (i) an input stage comprising the first capacitor 42', first inductor 44', and second capacitor 46'; and (ii) an output stage comprising the fifth capacitor 62, third inductor 60, and sixth capacitor 64. Likewise, the second arm 38' also comprises two stages: (i) an input stage comprising the third capacitor 48', second inductor 50', and fourth capacitor 52'; and (ii) an output stage comprising the seventh capacitor 68, fourth inductor 66, and eighth capacitor 70. The resistor 54' connects (a) the connection between the input stage and the output stage of the first arm to (b) the connection between the input stage and the output stage of the second arm. The division of power between the first arm and the second arm may be controlled by selecting the ratio of the impedance of the input stage of the each arm relative to the output stage of that arm, and by selecting the ratio of the impedance of the input stage of the first arm to the impedance of input stage of the second arm. For example, a ratio of power division, R, may be provided between a 'main branch' arm which takes more of the power from the input leg than a 'secondary branch' arm. To achieve this, the magnitude of the impedance of the input stage of the 'main branch' arm may be 1/R of the impedance of the input stage of the 'secondary branch' arm. The 'main branch' arm output stage may have an impedance equal to the 'main branch' arm input stage divided by the square root of (1+R). The 'secondary branch' output stage may have an impedance equal to the 'main branch' arm input stage divided by the square root of (R*(1+R)).

Any feature of any one of the examples disclosed herein may be combined with any selected features of any of the other examples described herein. For example, features of methods may be implemented in suitably configured hardware, and the configuration of the specific hardware described herein may be employed in methods implemented using other hardware.

It will be appreciated in the context of the present disclosure that lumped components may comprise discrete capacitors and inductors, as distinct from distributed elements such as microstrips or transmission lines which provide spatially distributed capacitance and/or inductance along their length. One example of a lumped component, which may be of particular utility in the provision of flat, low-profile devices such as smart cards, is a printed coil inductor. Such an inductor may comprise a laminar conductive coil on one surface of a dielectric, which follows a spiral path in from an input connection at the outside of the spiral to a connection through the dielectric inside the spiral. On the other side of the dielectric, a second laminar conductive coil may follow a mirror image of the same path out from this connection to an output connection at the outward edge of the spiral. The output connection may also be connected back through the dielectric so that input and output to the inductor may be provided on the same surface of the dielectric. The dielectric may comprise a substrate upon which a circuit is printed in the manner of a PCB. Other types of printed coil inductors may be used.

It will be appreciated from the discussion above that the embodiments shown in the Figures are merely exemplary, and include features which may be generalised, removed or replaced as described herein and as set out in the claims. With reference to the drawings in general, it will be appreciated that schematic functional block diagrams are used to indicate functionality of systems and apparatus described herein. It will be appreciated however that the functionality need not be divided in this way, and should not be taken to imply any particular structure of hardware other than that described and claimed below. The function of one or more of the elements shown in the drawings may be further subdivided, and/or distributed throughout apparatus of the disclosure. In some embodiments the function of one or more elements shown in the drawings may be integrated into a single functional unit.

In some examples the functionality of the controller may be provided by a general purpose processor, which may be configured to perform a method according to any one of those described herein. In some examples the controller may comprise digital logic, such as field programmable gate arrays, FPGA, application specific integrated circuits, ASIC, a digital signal processor, DSP, or by any other appropriate hardware. In some examples, one or more memory elements can store data and/or program instructions used to implement the operations described herein. Embodiments of the disclosure provide tangible, non-transitory storage media comprising program instructions operable to program a processor to perform any one or more of the methods described and/or claimed herein and/or to provide data processing apparatus as described and/or claimed herein. The controller may comprise an analogue control circuit which provides at least a part of this control functionality. An embodiment provides an analogue control circuit configured to perform any one or more of the methods described herein.

The above embodiments are to be understood as illustrative examples. Further embodiments are envisaged. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

The invention claimed is:

1. A mounting system for a near field RF communications chip, the system comprising:
   a substrate for carrying electronic components, and for providing electrical interconnections therebetween;
   a chip coupling carried by the substrate for connecting a near field RF communications chip to the mounting system;
   an auxiliary power provider, separate from said near field RF communications chip, and adapted for providing electrical power output based on a received alternating electrical signal; and,
   an antenna coupling for connecting a near field RF communications antenna to said mounting system; and
   a splitter, for splitting alternating electrical signals, the splitter comprising:
      a first port connected to the antenna coupling and having a first input impedance;
      a second port connected to the first port and configured to provide a first part of the alternating electrical signal to the auxiliary power provider; and
      a third port connected to the first port and configured to provide a second part of the alternating electrical signal to the chip coupling;
   wherein the splitter is configured to maintain the first input impedance so that:
      the output impedance of the second port is maintained in the event of fluctuations in the output impedance of the third port; and
      the output impedance of the third port is maintained in the event of fluctuations in the output impedance of the second port.

2. The mounting system of claim 1 wherein the first input impedance is matched to the output impedance of said near field RF communications antenna, and the output impedance of the second port is selected to match the input impedance of the near field RF communications chip.

3. The mounting system of claim 1 wherein the splitter is configured to provide, at the first port, variations in electrical load corresponding to the variations in electrical load at the third port.

4. The mounting system of claim 1 wherein the splitter is configured so that the first part of the alternating electrical signal comprises more power than the second part of the alternating electrical signal.

5. The mounting system of claim 1 wherein the splitter comprises a network of lumped components.

6. The mounting system of claim 5 wherein the network comprises a Wilkinson divider.

7. A near field RF communications apparatus comprising:
   a near field RF communicator;
   an antenna for coupling with an alternating H-field;
   an auxiliary rectifier, separate from the near field RF communicator
   a splitter comprising a network of lumped components, wherein the network is connected to receive an alternating electrical signal from the antenna, and to provide a first part of the alternating electrical signal to the auxiliary rectifier and to provide a second part of the alternating electrical signal to the near field RF communicator, wherein the splitter comprises
a first port connected to the antenna and having a first input impedance;
a second port connected, by the network, to the first port and connected to the auxiliary rectifier; and
a third port connected, by the network, to the first port and to the near field RF communicator.

8. The near field RF communications apparatus of claim 7 wherein the splitter is configured so that:
the output impedance of the second port is maintained in the event of fluctuations in the output impedance of the third port; and
the output impedance of the third port is maintained in the event of fluctuations in the output impedance of the second port.

9. The near field RF communications apparatus of claim 8 wherein the first input impedance is matched to the output impedance of the antenna, and the second port has an output impedance selected to match the input impedance of the near field RF communicator.

10. The near field RF communications apparatus of claim 7 wherein the near field RF communicator is provided by an integrated circuit, such as a chip, that is separate from the splitter.

11. A mounting system for a near field RF communications chip, the system comprising:
a substrate for carrying electronic components and electrical interconnections therebetween;
a chip coupling carried by the substrate for connecting a near field RF communications chip to the mounting system;
an auxiliary power provider, separate from said near field RF communications chip, and adapted for providing electrical power output based on a received alternating electrical signal; and,
an antenna coupling for connecting a near field RF communications antenna to said mounting system; and
a splitter, for splitting alternating electrical signals, the splitter comprising a network of lumped capacitors comprising:
a first stage, MN1, connected to the antenna coupling and having a first input impedance Z1 and a first output impedance Z1';
a second stage, MN2, connected to the first stage and to the auxiliary power provider for providing a first part of the alternating electrical signal to the auxiliary power provider, the second stage having second input impedance Z2' and a second output impedance Z2; and
a third stage, MN3, connected to the first stage and to the chip coupling for providing a second part of the alternating electrical signal to the chip coupling, the second stage having third input impedance Z3' and a third output impedance Z3;
wherein the lumped capacitors have capacitance values selected so that the first output impedance, Z1', matches the complex conjugate of the sum of the second input impedance, Z2', and the third input impedance, Z3'.

12. The apparatus of claim 11 wherein the network consists solely of lumped components.

13. The apparatus of claim 12 wherein the lumped components are capacitors.

14. The apparatus of claim 11 wherein the capacitances of the lumped capacitors are chosen so that the real part of the first output impedance, Z1', is greater than or equal to the real part of the first input impedance Z1.

15. The apparatus of claim 11 wherein the capacitances of the lumped capacitors are chosen so that the real part of the second input impedance, Z2', is less than or equal to the real part of the second output impedance Z2.

16. The apparatus of claim 11 wherein the capacitances of the lumped capacitors are chosen so that the real part of the third input impedance, Z3', is less than or equal to the real part of the third output impedance Z3.

17. The apparatus of 11 wherein the network is configured so that the second output impedance is maintained in the event of fluctuations in the third output impedance; and
the third output impedance is maintained in the event of fluctuations in the second output impedance.

18. The apparatus of 11 wherein the network is configured so that, in the event of fluctuations of Z1, Z2 and Z3: Z1' is still the complex conjugated of the addition of Z2' and Z3', with a maximum error of 70% in both the real and imaginary part.

* * * * *